Dec. 19, 1967 P. S. SWARTZ ETAL 3,359,516

ASYMMETRIC SUPERCONDUCTIVE DEVICE

Filed Oct. 3, 1966

3 Sheets-Sheet 1

Inventors:
Paul S. Swartz,
Howard R. Hart, Jr.,
by Edward D. Murphy
Their Attorney.

Inventors:
Paul S. Swartz,
Howard R. Hart, Jr.,
by Edward D. Murphy
Their Attorney.

Inventors:
Paul S. Swartz,
Howard R. Hart, Jr.,
by Edward D. Murphy
Their Attorney.

3,359,516

ASYMMETRIC SUPERCONDUCTIVE DEVICE

Paul S. Swartz and Howard R. Hart, Jr., Schenectady, N.Y., assignors to General Electric Company, a corporation of New York Filed Oct. 3, 1966, Ser. No. 583,876
9 Claims. (Cl. 335—216)

The present invention relates generally to the field of superconductivity and is particularly directed to a novel asymmetrically conducting superconductive device.

Superconductive switching devices are of importance in the field of large electronic computers where minimum space requirements and high efficiency of operation are required. However, most of the superconductive switching devices previously suggested have generally been of the type wherein the impedance of the device is symmetric and is not sensitive to the direction of current flow therein. In other cases, the degree of discrimination between currents in opposing directions has not been as high as is required for practical utility.

It is accordingly an object of the present invention to provide a novel superconductive device which presents an asymmetric impedance to an applied current.

It is another object of the present invention to provide an improved superconductive rectifying device.

Briefly, in accord with one embodiment of the present invention, a superconductive rectifying device is provided which comprises a flat elongated superconductive strip and another conducting strip adjacent and parallel to, but insulated from, the superconductive strip. A control current applied through the second strip produces a perpendicular magnetic field ranging from a positive maximum through zero to a negative maximum across its width. In a preferred embodiment, the device comprised an elongated strip of superconductive material having an insulating layer and a normally conductive layer deposited thereon. In the case of a type I superconductor or of a type II superconductor operated in the pure superconducting state, a thin film superconductor should be used. In the case of type II superconductor operated above $H_{c1}$, in the mixed state or the surface sheath state, a magnetic field is applied in a direction parallel to the width of the strip in order to bias the superconductor into the desired state.

The novel features believed characteristic of the invention are set forth in the appended claims. The invention itself, together with further objects and advantages thereof may best be understood by reference to the following description taken in connection with the appended drawings in which:

Figure 1:
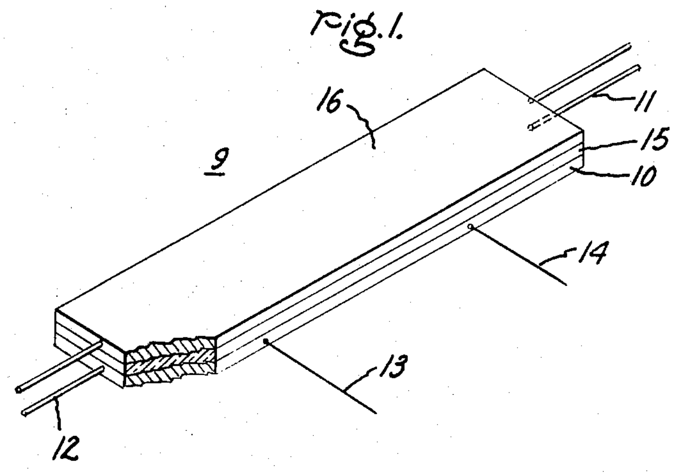
FIGURE 1 is a perspective view of a superconductive rectifying device in accord with the present invention.

In FIGURE 1, a rectifying device 9 is illustrated comprising an elongated strip 10 of superconductive material. Current leads 11 and 12 are soldered to the ends of the strip 10 while voltage leads 13 and 14 are connected to central locations on the strip as shown in the drawing for determining the presence or absence of a voltage drop to indicate the conduction state of the strip. The strip 10 may comprise any suitable type I or type II superconductive material. An alloy of lead and thallium (95% lead and 5% thallium), preferably annealed, is an example of a type II superconductor which has been used with particular success. The leads 11–14 may be indium. The device 9 further comprises a region 15 of insulating material and a layer 16 of conducting material overlying the superconductive strip. For example, the insulating region 15 may comprise a space which fills with liquid helium in use or a layer of insulating material may be used. The conductor 16 may be copper or a suitable superconductor. Each of the layers may be simply placed in contact with the next layer or deposition or other mounting techniques may be used.

Figure 2:
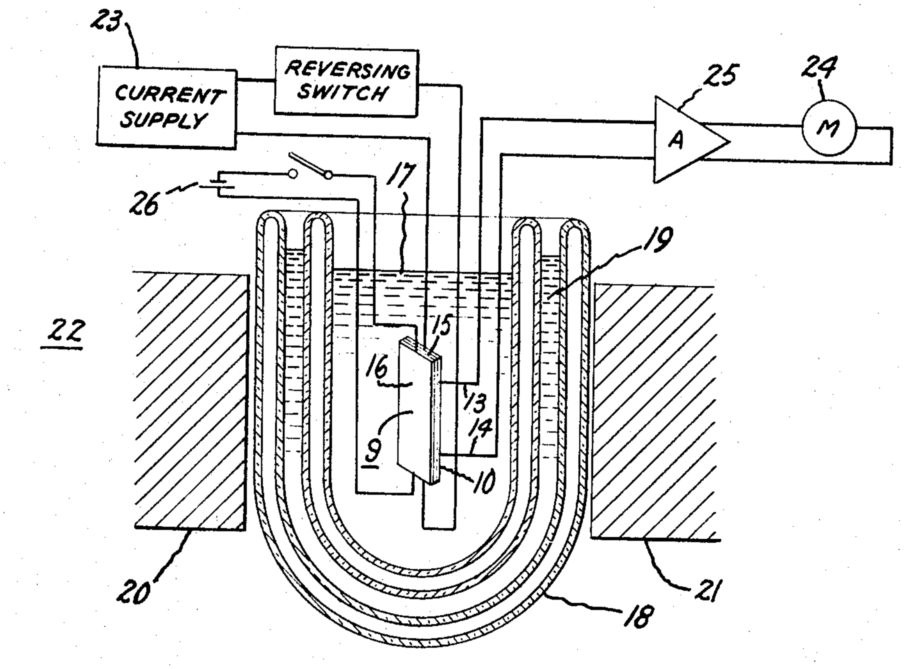
FIGURE 2 is a schematic view, partially in cross section of apparatus for testing or utilizing the device of the present invention.

In FIGURE 2, apparatus is illustrated for testing or utilizing the device of the present invention. The strip 10 is shown submerged in the body 17 of liquid helium contained in a Dewar flask 18, between the inner and outer walls of which a body of liquid nitrogen 19 is provided for insulation purposes. The device 9 is so situated in Dewar flask 18 so as to be located centrally between the two poles 20 and 21 of an electromagnet 22, shown only fragmentarily. For test purposes, magnet 22 is mounted so as to produce a magnetic field vector parallel to the device 9. Currents in the active strip 10 in FIGURE 2 are produced by a current supply indicated at 23 and may be reversed in polarity by the reversing switch. Any voltage drop through strip 10 is measured by meter 24 after amplification by an amplifier indicated at 25 which is connected to the voltage leads 13 and 14.

The apparatus of FIGURE 2 may be used to produce current in the strip 10 by passing DC current through the strip from current supply 23 and the reversing switch and to determine whether or not these currents are supercurrents by measuring the voltage drop, if any, by means of amplifier 25 and meter 24. The critical current, is defined as that current which produces a measurable voltage drop. The control current is supplied by battery 26.

The device of the present invention is based in part on the realization of the fact that the magnetic field of a conducting strip is generated by currents in elemental regions of the conductor and that these add to produce a perpendicular component adjacent the strip which ranges from a maximum positive value through zero to a negative maximum across the width of the strip so that a superconductive strip adjacent the control strip is subjected to this field. A current in the superconductor sets up a similar magnetic field. We have found that the perpendicular components of these magnetic fields add or cancel depending on the relative polarity of the currents. We have also found that when these components add, the critical current of the superconductor is substantially lower than it is when these components cancel. Accordingly, by setting up a control current of predetermined polarity in the control conductor, discrimination between currents of the same or of opposite polarity in the superconductor is obtained and rectification can be achieved.

Figure 3:
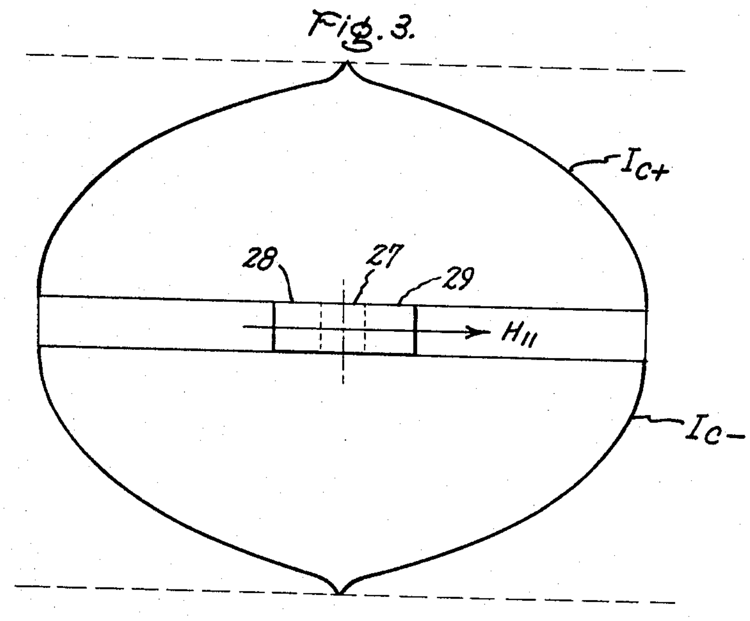
FIGURE 3 is a chart illustrating the critical currents for currents of opposing polarity in a flat superconductive strip.

More specifically, it is known that the critical current of a superconductor is decreased by the existence of a magnetic field component perpendicular to the superconductive surface. Consider the situation in a superconductive flat strip in which a current is flowing. In the element along the center line of the strip, region 27 in FIGURE 3, the magnetic field perpendicular to the surface is always zero because of the symmetric distribution of all elements about the center. However, the regions 28 and 29 of the superconductor immediately adjacent the central region experience a net magnetic field perpendicular to the surface which is generated by the current through all other surface elements. Accordingly, since the critical current is decreased by a perpendicular field, the critical current in these regions is slightly less than that in the central region. Similarly, each successive pair of regions, extending from the center toward the two sides, experience successively greater uncompensated perpendicular magnetic fields than the regions of the superconductor at a shorter distance from the center. In each case, as the perpendicular magnetic field, here produced by the current itself, increases in the successive regions, the critical current, or super-current carrying capacity of the region, decreases. Thus, the current carrying capacity of the overall strip for currents of opposite polarity is indicated by the two curves $I_{c+}$ and $I_{c-}$ shown in FIGURE 3. It is noted that, in this case, there is no adjacent conducting strip to set up an adding or opposing magnetic field and therefore the capacity of the strip is symmetric for the currents of opposite polarity.

Figure 4:
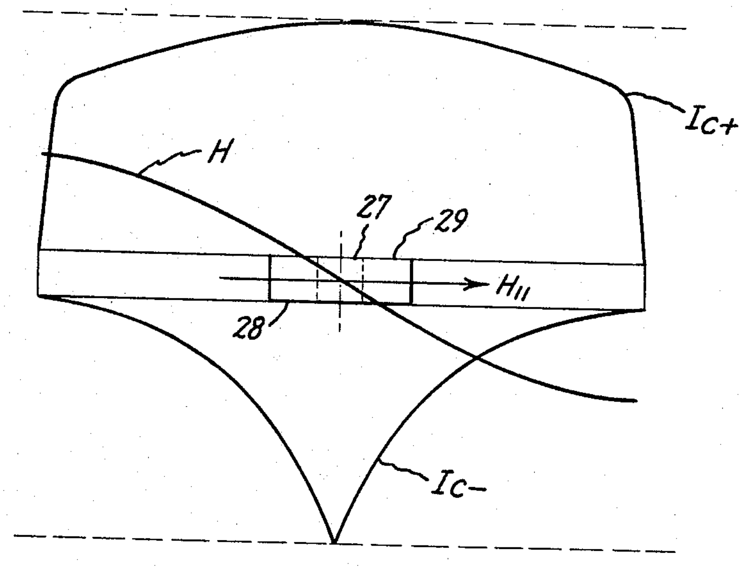
FIGURE 4 is a chart illustrating the critical currents for opposing current direction in a strip configuration corresponding to that of the present invention.

FIGURE 4 illustrates a situation wherein a perpendicula magnetic field H ranging from a positive maximum at one strip edge, through zero along the centerline, to a negative maximum at the second edge, is applied across the width of the superconductive strip. In accord with the present invention, this is done by providing an adjacent conductor carrying a control current which sets up a magnetic field similar to that described in connection with FIGURE 3; however, for ease of illustration, only the resultant magnetic field is shown. The magnitude of the control current, and of the perpendicular magnetic field which it produces, is selected in anticipation of the value of the perpendicular magnetic field generated by the current to be applied to the strip; of the type superconductor used; and, in the case of a type II superconductor, of the parallel magnetic field applied. For example, in the case of annealed lead thallium ribbon 2″ long by 0.250″ wide by 0.003″ thick to which a parallel field of 400 oersteds is applied, a control current of approximately 20 amps is used to produce a distribution of perpendicular field of appropriate magnitude across the width of the active strip.

As illustrated in FIGURE 4, the critical current for such a configuration is dependent on the polarity of the applied current. Considering the current through the central region 27 of the strip and the perpendicular magnetic field generated thereby in the adjacent strip regions 28 and 29, if the applied current is in a direction out of the paper in FIGURE 4, the perpendicular magnetic field is upward in the adjacent region 29 to the right and downward in the region 28 to the left. Therefore, the magnetic field generated by such a current substracts from the control current field and, if the magnitudes are properly selected, essentially cancels the control field. The regions adjacent the central region of the strip therefore experience a total perpendicular magnetic field nearly equal to zero; and accordingly, the critical current in these regions is nearly equal to the maximum possible value. Similarly, it can be seen that in each case, the magnetic field produced by regions of the superconductive strip which contribute to the perpendicular magnetic field at any given point along the strip add to a net field which tends to cancel the control field when the current direction is out of the paper. Accordingly, the critical current across nearly all of the strip is close to the maximum possible critical current as shown by the curve $I_{c+}$.

On the other hand, if the current applied to the strip is into the paper in FIGURE 4, the magnetic fields generated by the currents applied to the strip reverse in direction from the above description and, as a result, these add to the control field. Therefore, each region of the strip other than the central region experiences a large magnetic field in a direction perpendicular to the surface and the critical current, is substantially reduced as shown by the curve $I_{c-}$.

Accordingly, in the illustration of FIGURE 4, if a voltage sensing circuit is applied to a portion of the length of the strip and the applied current is of a value between the critical currents for the strip for currents of opposing polarity, the voltage sensing means can distinguish between opposing polarities by virtue of the fact that in one direction the applied current is less than the critical value and no voltage drop is generated while in the opposite direction the applied current is greater than the critical current and a voltage drop is generated. Accordingly, such a system could be used in a computer as a "0-or-1" indicator. As another example, the superconductor might be placed in parallel with a circuit including a load with a resistance which is finite but less than the normal resistance of the superconductor. In this situation, the load only receives current of the polarity which causes normal conduction in the superconductor.

Figure 5:
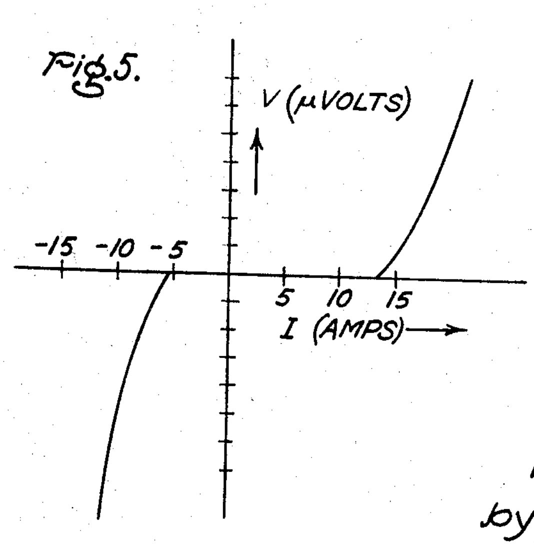
FIGURE 5 is a chart illustrating the rectification achieved by means of the present invention.

FIGURE 5 demonstrates the degree of rectification of an externally applied super-current which can be achieved by means of this invention. In this figure, the voltage drop measured along the strip is plotted against the current applied to the superconductor at a fixed control current. The data for this figure is obtained using the apparatus of FIGURE 2. As can be seen in this view, a voltage drop appeared at approximately 5.4 amps in the negative direction while in the positive direction, no voltage drop appeared until an applied current of 14.7 amps was reached. Thus, in a situation where it is desired to indicate information by means of the polarity of a current, the circuit would be arranged to provide a current of about 9 amps in a direction dependent on the information to be indicated. This current would produce an output in one direction but none in the other, thus providing the desired indication.

The control strip which establishes the desired magnetic field for operation of this invention may be either a normal conductor or a superconductor. The current in a normal conductor is uniform across the width of the strip and produces an optimum distribution of perpendicular field. This is also the case for some superconductors operated under proper conditions, such as $Nb_3Sn$ when the applied current is at or near the critical value. However, in some superconductive materials, the current may be affected by considerations of perpendicular field and critical current similar to those on which this invention is based. Consequently, the field produced thereby may not be sufficiently similar to that produced in the active strip for maximum discrimination between currents to be achieved. This difficulty may be overcome by providing a segmented superconductive control strip wherein the segments are connected in series.

Figure 6:
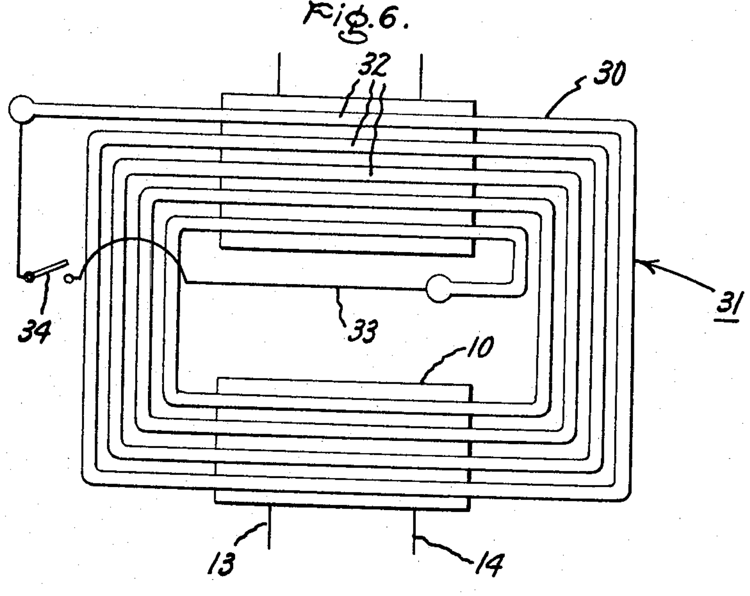
FIGURE 6 is a partial illustration of an alternative device in accord with this invention.

A device embodying this concept is illustrated in FIGURE 6. The active superconducting strip 10 is disposed adjacent one leg 30 of a rectangular superconductive spiral 31. The control current is applied through the ends of the spiral 31 so that each segment 32 of leg 30 carries an equal current. A sufficient number of segments is provided, preferably four or more, so that current variations within the width of each of the individual segments are not significant. Thus, the leg 30 functions as the control strip to establish the desired perpendicular field distribution across the active strip 10. It is noted that, since the remaining legs of spiral 31 also carry a uniform control current, these may also be used as control strips for further active strips 10 associated therewith, thus providing a compact structure including up to four rectifiers.

Provision is also made in the illustrated structure for connecting the ends of the spiral through a superconductive lead 33 and a superconductive switch 34. Thus, once a current is produced in the spiral, the switch 34 can be closed and the power supply removed, and the control current can persist indefinitely without using power.

This invention has been illustrated and described in terms of the structures shown in FIGURES 1 and 5. A particular feature of these configurations is that they are easily constructed and occupy a minimum space. However, it will be apparent to those skilled in the art that changes and modifications may be made without departing from the invention in its broader aspects. We therefore intend the appended claims to cover all such changes and modifications as fall within the true spirit and scope of our invention.

What we claim as new and desire to secure by Letters Patent of the United States is:

1. An asymmetrically conducting superconductive device comprising an elongated active strip of superconductive material having a surface; an elongated control strip of conductive material disposed parallel to and adjacent said superconductive strip; an insulating medium interposed between said strips; means for applying a current to said control strip to produce a magnetic field perpendicular to said active strip; said magnetic field ranging from a positive maximum to a negative maximum across the width of said active strip; and means for applying a current to said active strip in the direction of said elongation.

2. An asymmetrically conducting device as claimed in claim 1 wherein said active strip, said insulating medium and said control strip comprise a series of contiguous layers.

3. An asymmetrically conducting device as claimed in claim 1 wherein said perpendicular magnetic field is essentially cancelled by a current of one polarity in said active strip and substantially increased in value in each elemental region by a current of opposite polarity in said active strip.

4. An asymmetrically conducting device as claimed in claim 3 wherein the magnitude of the current applied to said active strip is less than the critical current of said active strip when the field due to said applied current cancels said control field and greater than the critical current when said field is increased.

5. An asymmetrically conducting device as claimed in claim 1 wherein said superconductive material comprises a type II superconductor.

6. An asymmetrically conducting device as claimed in claim 5 and including means for applying a magnetic field parallel to said surface of said active strip, said field having a value sufficient to bias said superconductive material into at least the mixed conduction state thereof.

7. An asymmetrically conducting device as claimed in claim 1 wherein said control strip comprises a superconductor.

8. An asymmetrically conducting device as claimed in claim 7 wherein said control strip comprises a plurality of segments disposed in parallel geometrically; said segments being electrically connected in series such that the currents in all of said segments are in the same direction.

9. An asymmetrically conducting device as claimed in claim 8 and including superconductive means for connecting the ends of said series of segments to permit a current flowing therein to persist.

References Cited

UNITED STATES PATENTS 3,182,275 5/1965 Newhouse et al. ------ 338—32

BERNARD A. GILHEANY, *Primary Examiner.*

GEORGE HARRIS, Jr., *Examiner.*